US008352895B2

(12) United States Patent
Wason et al.

(10) Patent No.: US 8,352,895 B2
(45) Date of Patent: Jan. 8, 2013

(54) MODEL LIBRARY IMPLEMENTATION AND METHODOLOGY FOR WORST CASE PERFORMANCE MODELING FOR SRAM CELLS

(75) Inventors: Vineet Wason, Santa Clara, CA (US); Kevin J. Yang, Santa Clara, CA (US); Sriram Balasubramanian, Fremont, CA (US); Lingquan Wang, Santa Clara, CA (US); Varsha Balakrishnan, Palo Alto, CA (US); Juhi Bansal, Sunnyvale, CA (US); Zhi-Yuan Wu, Union City, CA (US); Karthik Chandrasekaran, Essex Junction, VT (US); Arunima Dasgupta, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 38 days.

(21) Appl. No.: 12/974,170

(22) Filed: Dec. 21, 2010

(65) Prior Publication Data
US 2012/0159419 A1 Jun. 21, 2012

(51) Int. Cl.
G06F 9/455 (2006.01)
G06F 17/50 (2006.01)
(52) U.S. Cl. .................... 716/108; 716/113; 716/134
(58) Field of Classification Search .................. 716/108, 716/113, 134
See application file for complete search history.

(56) References Cited

U.S. PATENT DOCUMENTS

2007/0044049 A1* 2/2007 Adams et al. .................... 716/4
2008/0141190 A1* 6/2008 Jung et al. .................... 716/4

* cited by examiner

*Primary Examiner* — Thuan Do
*Assistant Examiner* — Brian Ngo
(74) *Attorney, Agent, or Firm* — Ditthavong Mori & Steiner, P.C.

(57) ABSTRACT

Worst case performance of an SRAM cell may be simulated more accurately with less intensive computations. An embodiment includes determining, by a processor, a process corner G of an SRAM cell, having pull-down, pass-gate, and pull-up devices, process corner G being defined as the worst performance of the cell when only global variations of parameters of the SRAM cell are included, setting each of the pull-down, pass-gate, and pull-up devices at process corner G, performing, on the processor, a number of Monte Carlo simulations of the SRAM cell devices around process corner G with only local variations of the parameters, generating a normal probability distribution for $I_{read}$ based on the local Monte Carlo simulations around process corner G, extrapolating the worst case $I_{read}$ from the normal probability distribution of $I_{read}$ to define a process corner SRM representing a slowest SRAM bit on a chip, and validating an SRAM cell based on the SRM corner. Embodiments further include creating a library of SRM corner values for multiple SRAM cells, and validating an SRAM cell by selecting an SRM corner from the library. Embodiments further include linearly scaling the SRM corner value with global sigma input variations from 0 sigma to 6 sigma and/or with local sigma input variations from 0 sigma to 6 sigma, selecting a scaled SRM corner value at the sigma corresponding to design and memory size requirements for the SRAM cell, simulating the scaled SRM corner by a processor, and employing the simulated scaled SRM corner to validate performance of an SRAM cell.

7 Claims, 9 Drawing Sheets

| | SRAM PERFORMANCE: $I_{read}$ (μA) | | | | |
|---|---|---|---|---|---|
| SIGMA NUMBER | CELL 1 | CELL 2 | CELL 3 | CELL 4 | CELL 5 |
| -5 | 3.2 | 9.1 | 13.0 | 6.6 | 30.4 |
| -4 | 4.4 | 10.9 | 15.4 | 8.5 | 33.6 |
| -3 | 5.6 | 12.7 | 17.9 | 10.6 | 36.7 |
| -2 | 7.0 | 14.7 | 20.4 | 12.8 | 40.0 |
| -1 | 8.4 | 16.6 | 23.0 | 15.0 | 43.4 |
| 0 | 9.9 | 18.7 | 25.6 | 17.3 | 47.0 |
| 1 | 11.5 | 20.8 | 28.4 | 19.6 | 50.7 |
| 2 | 13.2 | 23.0 | 31.2 | 22.0 | 54.7 |
| 3 | 15.0 | 25.2 | 34.0 | 24.5 | 58.8 |
| 4 | 16.9 | 27.5 | 37.0 | 27.0 | 63.2 |
| 5 | 18.8 | 29.9 | 40.0 | 29.6 | 67.9 |

| $V_{dd}$/T (0.9V/-40C) | |
|---|---|
| corner_sigma_SRM_local (INPUT) | Output_sigma_iread_local (OUTPUT) |
| 0 | 0.0 |
| 1 | 1.0 |
| 2 | 1.9 |
| 3 | 2.8 |
| 4 | 3.8 |
| 5 | 5.0 |
| 6 | 6.1 |

| $V_{dd}/T$ (0.9V/-40C) | |
|---|---|
| Corner_sigma_SRM_global (INPUT) | Output_sigma_iread_global (OUTPUT) |
| 0 | 0.0 |
| 1 | 1.0 |
| 2 | 2.1 |
| 3 | 3.0 |
| 4 | 3.9 |

MODEL LIBRARY IMPLEMENTATION AND METHODOLOGY FOR WORST CASE PERFORMANCE MODELING FOR SRAM CELLS

TECHNICAL FIELD

The present disclosure relates to a new library implementation and method for modeling worst case performance for SRAM cells, and more particularly defines a new process corner to represent the slowest SRAM bit on a chip.

BACKGROUND

In semiconductor manufacturing, process corners represent extremes of fabrication parameter variations within which a circuit must function correctly. In other words, a corner is a model that represents the worst case scenario for a particular metric. To obtain the worst case performance, parameters are varied globally (chip to chip) and locally (within chip). Monte Carlo simulation, if appropriately calibrated, is an accurate way to explore circuit performance variations. However, this approach requires intensive computational resources. Fixed process corners are sought to provide coverage on various worst case scenarios (as seen in the Monte Carlo simulation) without invoking the computationally intensive Monte Carlo process. Known solutions are unable to capture the true worst case performance specific to SRAM cells, since existing corners perform a root mean square operation on local and global variation components. Also, existing solutions assume equal contributions from local and global components, which does not represent the true worst case bit on the chip. In addition, prior art process corners do not allow scaling behavior of worst case $I_{read}$ with respect to local and global sigma settings. Accordingly, each new customer design and/or memory size requirement necessitates a new set of Monte Carlo simulations.

A need therefore exists for more efficient and accurate methodology enabling simulation of true worst case performance for an SRAM and for designing SRAMs without running Monte Carlo simulations.

SUMMARY

An aspect of the present disclosure is an improved method of modeling worst case performance for SRAM cells by using $I_{read}$ as a metric for determining performance of the cell and by linearly adding global and local variation components.

Another aspect of the present disclosure is a library of SRM process corners, independent knobs for tuning local and global settings, a sum of local and global variation components, and an equation for linearly scaling the SRM process corners with respect to corner sigma knobs.

Another aspect of the present disclosure is a method of designing an SRAM cell for worst case performance by linearly scaling process corners simulated by linearly adding global and local variation components.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a computer-implemented method comprising: determining, by a processor, a process corner G of an SRAM cell, having pull-down, pass-gate, and pull-up devices, process corner G being defined as the worst performance of the cell when only global variations of parameters of the SRAM cell, such as channel length, channel width, and threshold voltage, are included; setting the pull-down, pass-gate, and pull-up devices at process corner G; performing, on the processor, a number of Monte Carlo simulations of the SRAM cell devices around process corner G with only local variations of the parameters; generating a normal probability distribution for $I_{read}$ based on the local Monte Carlo simulations around process corner G; extrapolating the worst case $I_{read}$ value from the normal probability distribution of $I_{read}$ to define a process corner SRM representing a slowest SRAM bit on a chip; and an SRAM cell based on the SRM corner.

Aspects of the present disclosure include determining process corner G by varying global parameters of channel length, channel width, and threshold voltage from one cell to another, and obtaining a probability distribution of $I_{read}$ values for the SRAM cell. Other aspects include setting the individual devices at the process corner G corresponding to the −3 sigma $I_{read}$ value arising from global variations. Another aspect includes running Monte Carlo simulations varying local parameters of channel length, channel width, and threshold voltage on an SRAM cell. Additional aspects include running 1 to 5 million Monte Carlo simulations. Further aspects include repeating the steps of determining a process corner G, setting individual devices at process corner G, performing Monte Carlo simulations, generating a normal probability distribution, and extrapolating the worst case $I_{read}$ for multiple SRAM cells; creating a library of SRM corner values for multiple SRAM cells; and validating an SRAM cell based on a selected SRM corner from the library. Another aspect includes tuning sigma values corresponding to local and global variations; and validating an SRAM cell by varying the channel length, channel width, and threshold voltage globally from 0 sigma to 6 sigma. Other aspects include tuning sigma values corresponding to local and global variations; and validating an SRAM cell by varying the channel length, channel width, and threshold voltage locally from 0 sigma to 6 sigma. An additional aspect includes tuning the SRM corner to appropriate global sigma settings according to design and memory size requirements.

Another aspect of the present disclosure is a non-transitory machine readable medium comprising a library of SRM corner values, the library further comprising: a local corner sigma knob for tuning local sigma settings; a global corner sigma knob for tuning global sigma settings; and a linear equation for scaling SRM values linearly with respect to the corner sigma knobs.

Aspects include a library comprising: the output from varying parameters globally from 0 sigma to 6 sigma; and the output from varying parameters locally from 0 sigma to 6 sigma. Further aspects include a library comprising: the output from varying channel length, channel width, and threshold voltage globally from 0 sigma to 6 sigma; and the output from varying channel length, channel width, and threshold voltage locally from 0 sigma to 6 sigma.

Another aspect of the present disclosure is a machine-implemented method of designing for worst case performance of an SRAM cell comprising: accessing a library, the library comprising SRM corner values, each SRM corner value comprising a linear sum of global and local components of $I_{read}$ values for an SRAM cell, the global components being determined by globally varying parameters of the SRAM cell to obtain an G corner, the local components being determined by locally varying the parameters around the obtained G corner; selecting an SRM corner value; linearly scaling the SRM corner value with global sigma input variations from 0 sigma to 6 sigma and/or with local sigma input variations from 0 sigma to 6 sigma; selecting a scaled SRM corner value at the sigma corresponding to design and memory size requirements for the SRAM cell; simulating the scaled SRM corner by a processor; and employing the simulated scaled SRM corner to validate worst case performance of a SRAM cell. Aspects include globally and locally varying channel length, channel width, and threshold voltage.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problems of inaccurate worst case performance and inability to tune worst case performance based on customer design and memory size requirements attendant upon modeling worst case performance for SRAM cells. In accordance with embodiments of the present disclosure, cell parameters are globally varied first to obtain a G corner, and then device parameters are locally varied around the G corner to obtain a new corner SRM to represent the slowest SRAM bit on the chip. The global and local components are added, resulting in a more accurate representation of worst case SRAM performance. Further, because of the linear addition of the global and local components, the SRM corner may be linearly scaled and thereby tuned to an appropriate sigma based on design and memory size requirements.

Methodology in accordance with embodiments of the present disclosure includes determining, by a processor, a process corner G of an SRAM cell, having pull-down, pass-gate, and pull-up devices; process corner G being defined as the worst performance of the cell when only global variations of parameters of the SRAM cell are included; setting each of the pull-down, pass-gate, and pull-up devices at process corner G; performing, on the processor, a number of Monte Carlo simulations of the SRAM cell devices around process corner G with only local variations of the parameters; generating a normal probability distribution for $I_{read}$ based on the local Monte Carlo simulations around process corner G; extrapolating the worst case $I_{read}$ from the normal probability distribution of $I_{read}$ to define a process corner SRM representing a slowest SRAM bit on a chip; and validating an SRAM cell based on the SRM corner.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
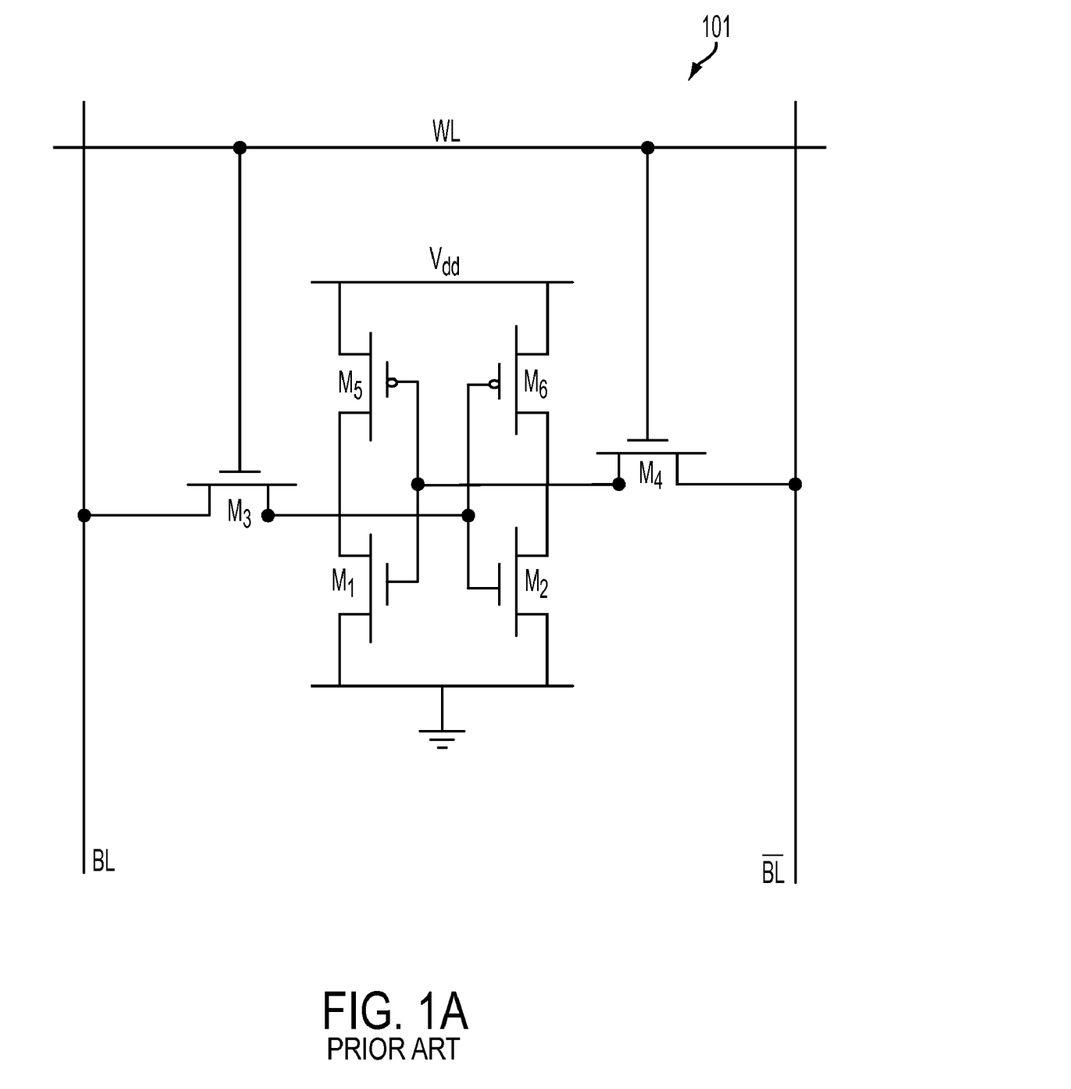
FIG. 1A schematically illustrates a prior art SRAM cell.

FIG. 1A illustrates a conventional 6T SRAM cell 101. As shown, transistors M1 and M2 are pull-down (NFET) devices, M3 and M4 are pass-gate (NFET) devices, and M5 and M6 are pull-up (PFET) devices. $I_{read}$ is defined as the current through bit line BL during a read operation of SRAM 101. The time it takes for bit line BL to discharge is directly proportional to the current $I_{read}$. Therefore, $I_{read}$ is representative of the speed at which data stored in an SRAM cell can be accessed. Accordingly, performance of SRAM cell 101 may be defined by $I_{read}$.

Figure 1B:
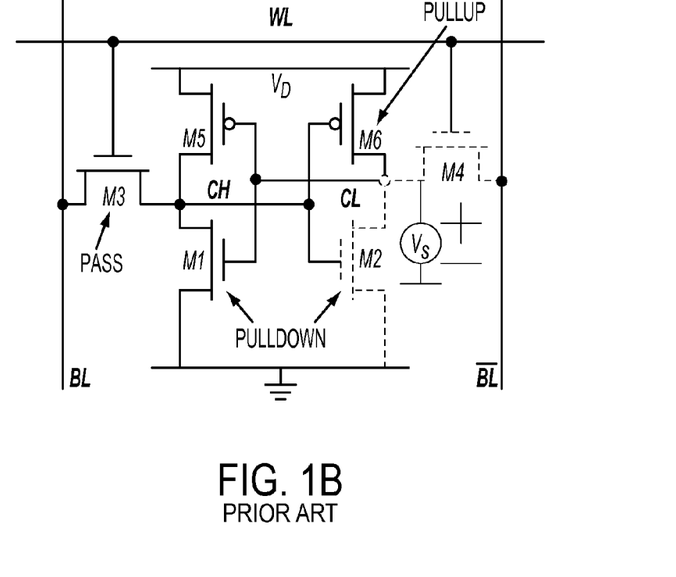
FIG. 1B schematically illustrates a prior art $I_{read}$ measurement set-up.
Figure 1C:
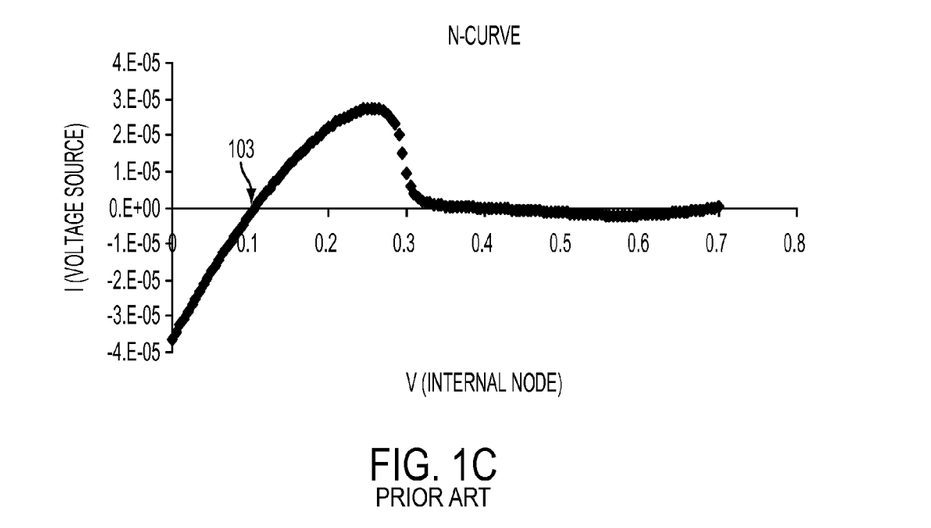
FIG. 1C graphically illustrates a prior art $I_{read}$ definition.

FIG. 1B schematically illustrates measurement set-up for an N-curve (see FIG. 1C) which is used to determine $I_{read}$. A voltage source $V_s$ is applied to an internal node voltage during the read operation, and the current through the voltage source is measured. The current through the voltage source is plotted against the internal node voltage as shown in FIG. 1C, which is called an N-curve. $I_{read}$ is defined as the current through BL bar when current through the voltage source $V_s$ is zero, i.e. at point 103. It is representative of the speed of reading the cell as it determines how fast bitlines can be discharged. Thus, it determines the performance of the cell. Worst case performance of the cell is defined at the point when $I_{read}$ is smallest.

Figure 2:
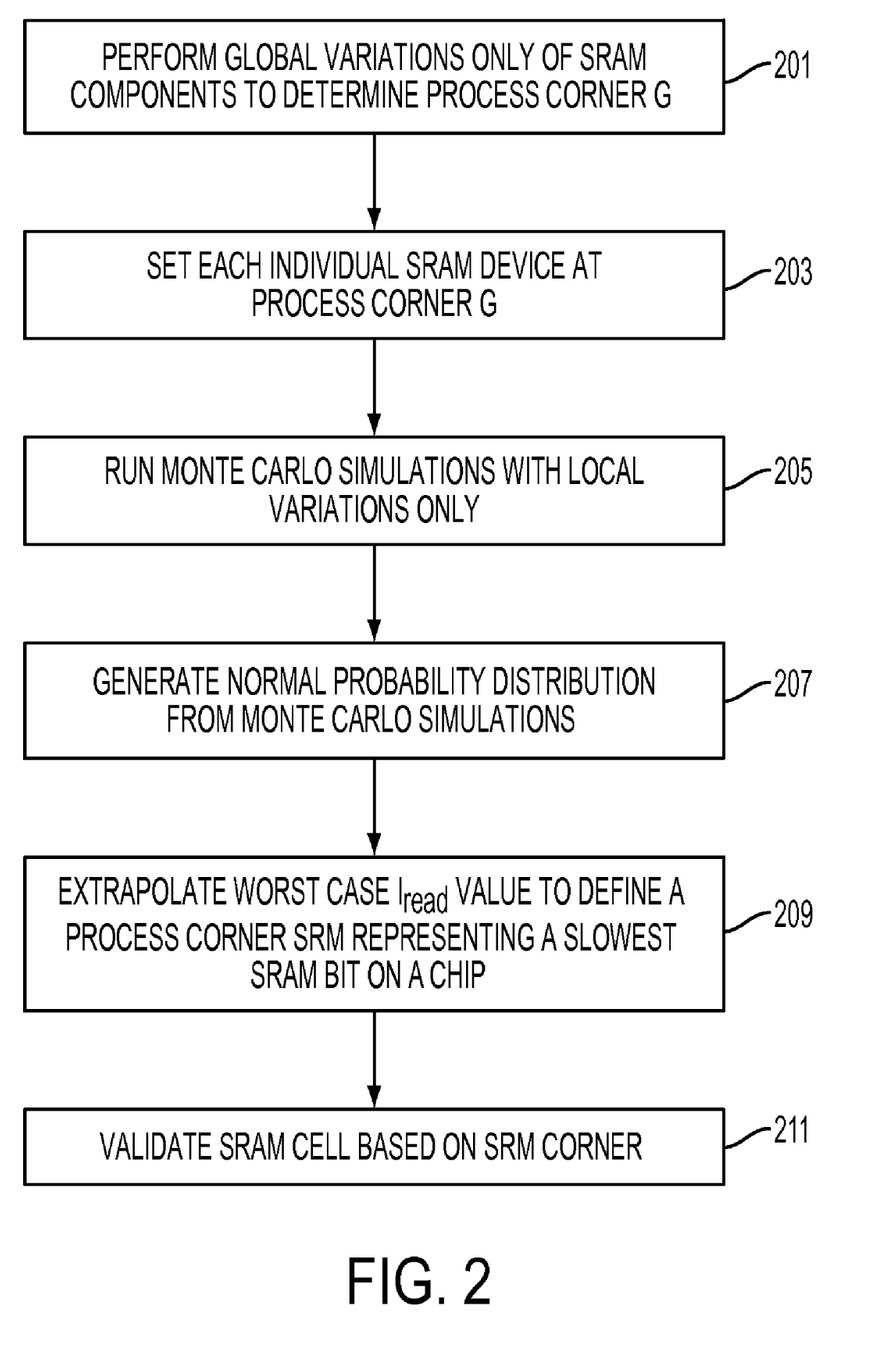
FIG. 2 illustrates a process flow in accordance with an exemplary embodiment.

Adverting to FIG. 2, a process flow in accordance with an exemplary embodiment is illustrated. In step 201, parameters of SRAM 101 such as channel length, channel width, and threshold voltage are varied globally, i.e., from cell to cell, and process corner G (which corresponds to the lowest value of $I_{read}$ when only global variations are present in the system) is obtained. Secondary factors may include oxide thickness, resistance variations, and mobility variations. The three SRAM devices are then set at corner G (step 203). Typically, the devices are set at the corner corresponding to the 3-sigma $I_{read}$ value arising from global variations.

In step 205, a number of Monte Carlo simulations, for example 1 to 5 million simulations, are run on a processor around the G corner, with only local variations turned on. Parameters such as channel length, channel width, and threshold voltage are varied on a single cell, while global parameters are held fixed at corner G. The number of Monte Carlo runs depends on design needs.

Figure 3:
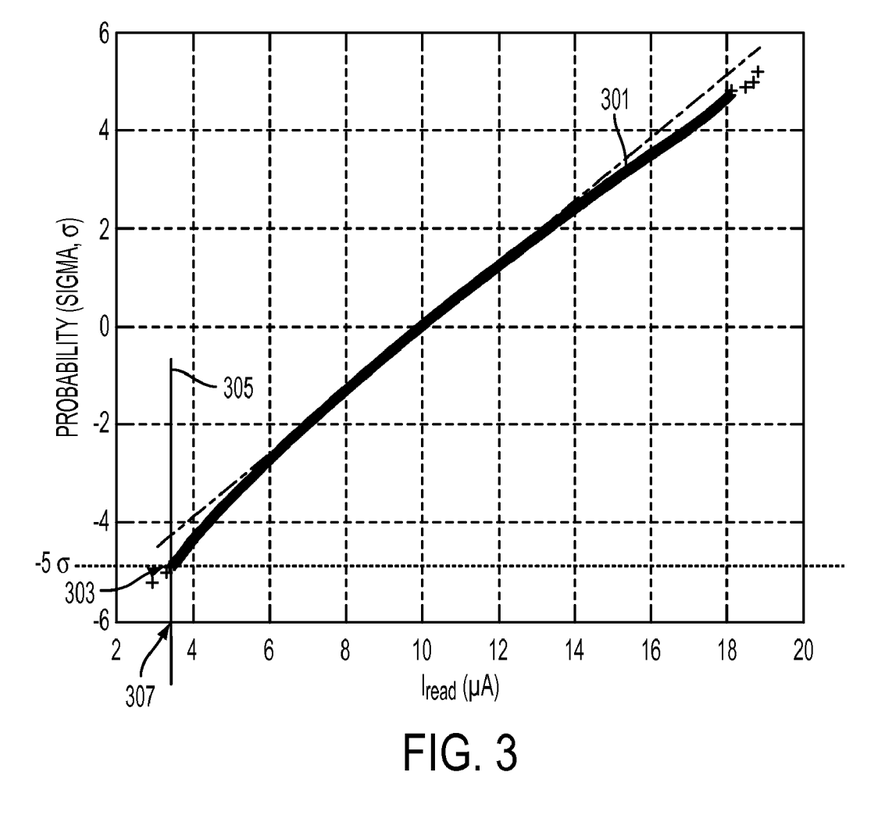
FIG. 3 illustrates an example of a normal probability distribution of $I_{read}$ arising from 5 million Monte Carlo runs.
Figure 4:
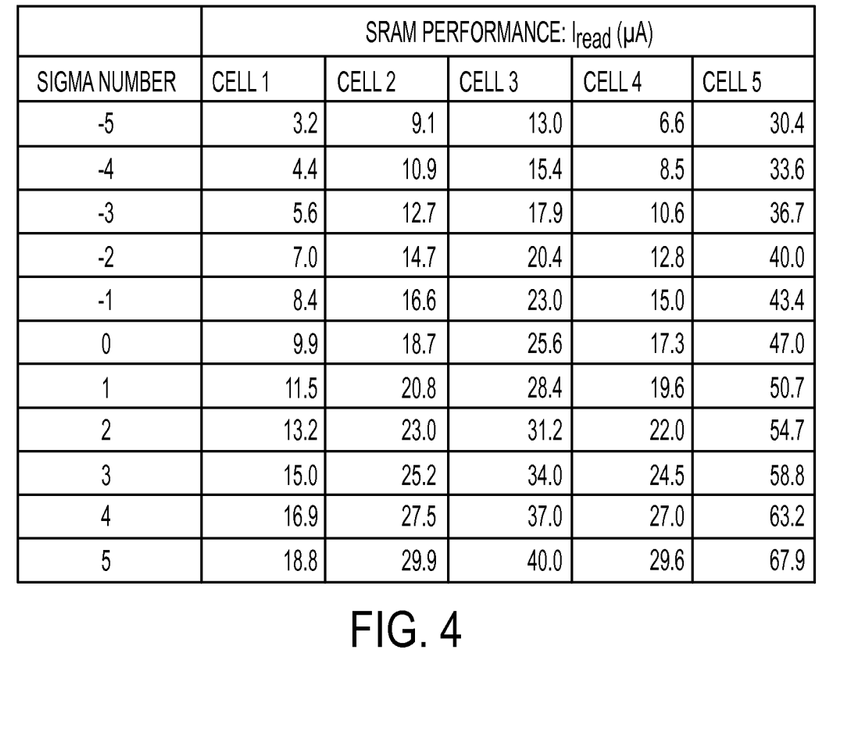
FIG. 4 illustrates a table of SRAM performance $I_{read}$ values in microamps (μA) for five different cells.

A normal probability distribution of $I_{read}$ may be generated from the Monte Carlo simulations in step 207. FIG. 3 shows an example of a normal probability distribution 301 of $I_{read}$ arising from 5 million Monte Carlo runs. As illustrated, because of the model limitations at extreme parameter combinations, normal probability distribution depicts a tail at the lower and higher ends. In order to determine $I_{read}$ at any given sigma, probability distribution 301 is fit to a fourth order polynomial. The intersection of the polynomial curve and the −5 sigma line is determined (shown at 303), and a perpendicular line 305 is dropped from point 303 to the x-axis. The intersection 307 of line 305 and the x-axis constitutes the SRM corner. SRAM performance $I_{read}$ values in microamps (μA) are tabulated as shown in FIG. 4 for five different cells at sigma conditions ranging from −5 to 5. These values were extrapolated from a normal probability distribution using a fourth order polynomial.

Adverting again to FIG. 2, in step 209, the worst case $I_{read}$ value, which usually corresponds to the −5 sigma point, is extrapolated from the normal probability distribution to define a process corner SRM representing a slowest SRAM bit on a chip. The SRM values may be stored in a library for reference by SRAM designers. Then, an SRAM cell may be validated for worst case performance based on the SRM corner (step 211). Designers may directly use SRM corners rather than running the computationally intensive Monte Carlo simulations.

Figure 5:
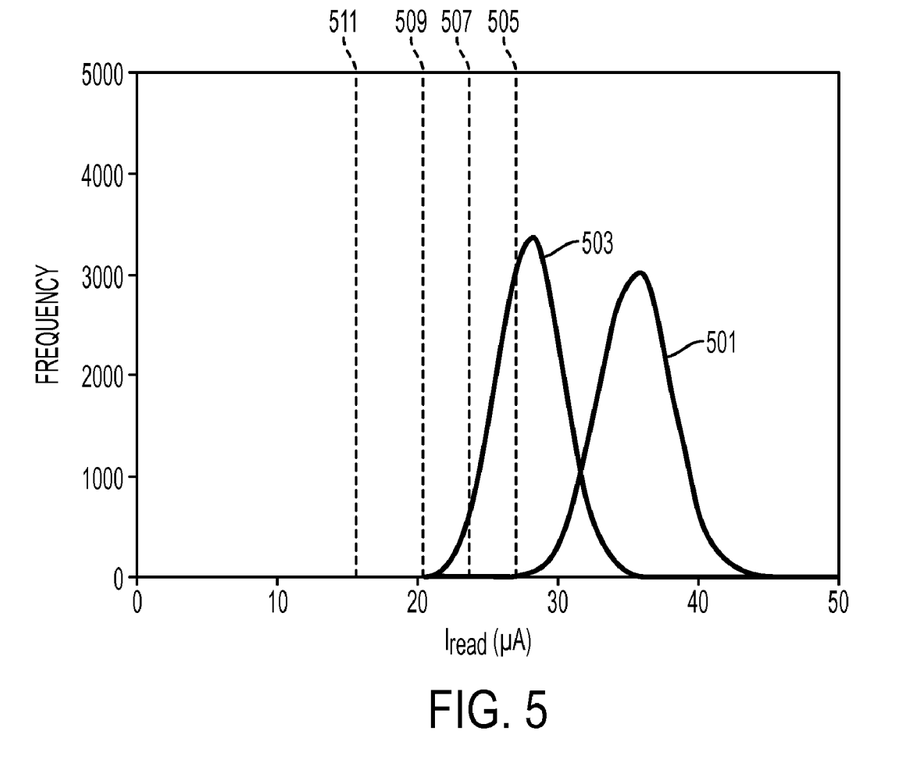
FIG. 5 illustrates a comparison of process corner SRM with existing corner definitions.

FIG. 5 illustrates a comparison of process corner SRM with existing corner definitions. The Gaussian distribution of Monte Carlo simulations, varying parameters globally around a typical corner, is illustrated at 501. The Gaussian distribution of Monte Carlo simulations varying parameters locally around a global (G) corner is illustrated at 503. Element 505 represents a G corner, the single cell 3 sigma $I_{read}$ limit from chip mean Monte Carlo simulations. 507 represents a performance (P) corner, the single cell 3 sigma $I_{read}$ limit from Monte Carlo simulations varying parameters both chip to chip and within chip and taking a root mean square sum of global and local variations. Similarly, a functional (F) corner, the single device (FET) 3 sigma limit from Monte Carlo simulations, varying parameters both chip to chip and within chip, is represented by 509. New corner SRM, the 5 sigma within chip and 3 sigma chip mean $I_{read}$ limit from Monte Carlo simulations when global and local components are added as a sum, is shown at 511. As illustrated, other corners (i.e., corners G, P, and F) are much more optimistic than the SRM corner and do not represent the true worst case bit on the chip. The SRM corner, which is more conservative from the global and local components being added as a sum, therefore allows for a greater product yield.

Figure 6A:
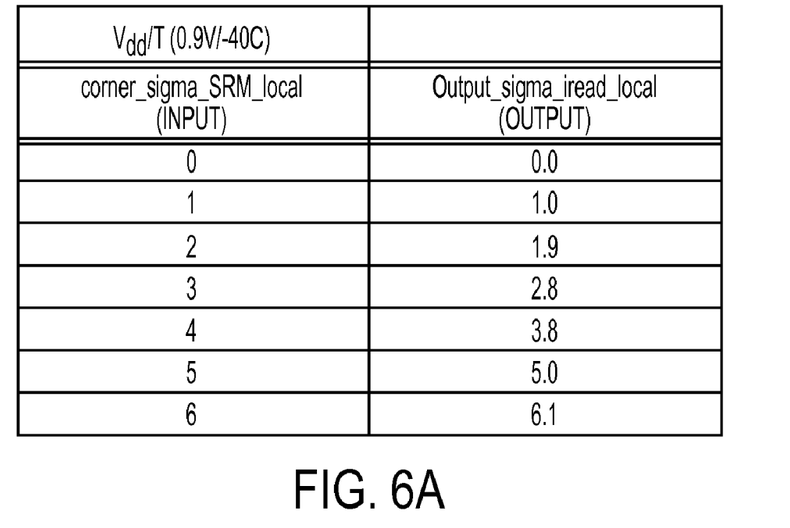
FIGS. 6A and 6B illustrate linear scalability of SRM with local input variations and FIGS. 6C and 6D illustrates linear scalability of SRM with global input variations.
Figure 6B:
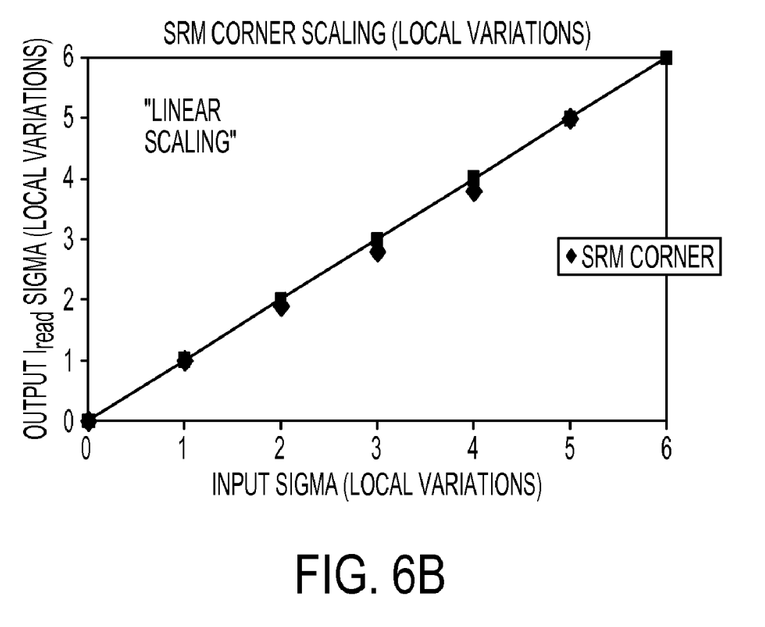
Figure 6C:
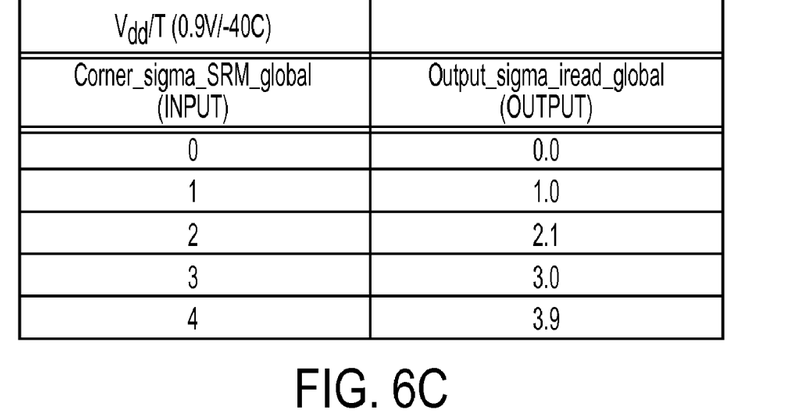
Figure 6D:
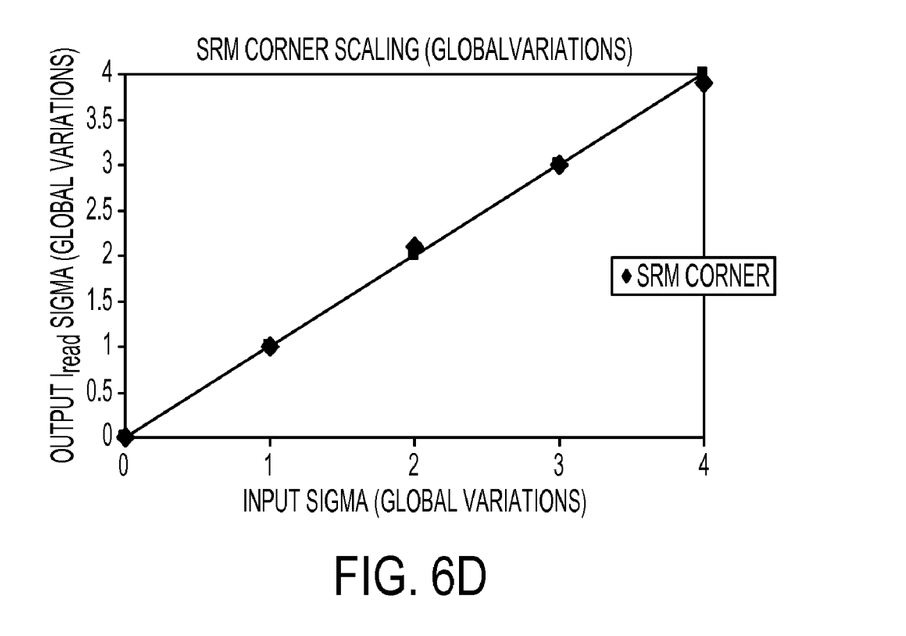

As previously stated, process corner SRM represents a linear sum of global and local components. Accordingly, the corner may be scaled for local or global variations rather than rerunning the Monte Carlo simulations. For example, as shown in FIGS. 6A and 6B, as local input variations (for channel width, channel length, and threshold voltage) are varied from 0 sigma to 6 sigma, the output sigma ($I_{read}$) also scales linearly. Similarly, as shown in FIGS. 6C and 6D, as global sigma input variations (for channel width, channel length, and threshold voltage) are varied from 0 sigma to 6 sigma, the output sigma ($I_{read}$) also scales linearly. Accordingly, a designer may simulate the corner at an appropriate desired sigma based on design/memory size requirements. By tuning locally to a high sigma, yield loss may be reduced sufficiently. Further, for larger memory size, a higher sigma point would be needed.

Figure 7:
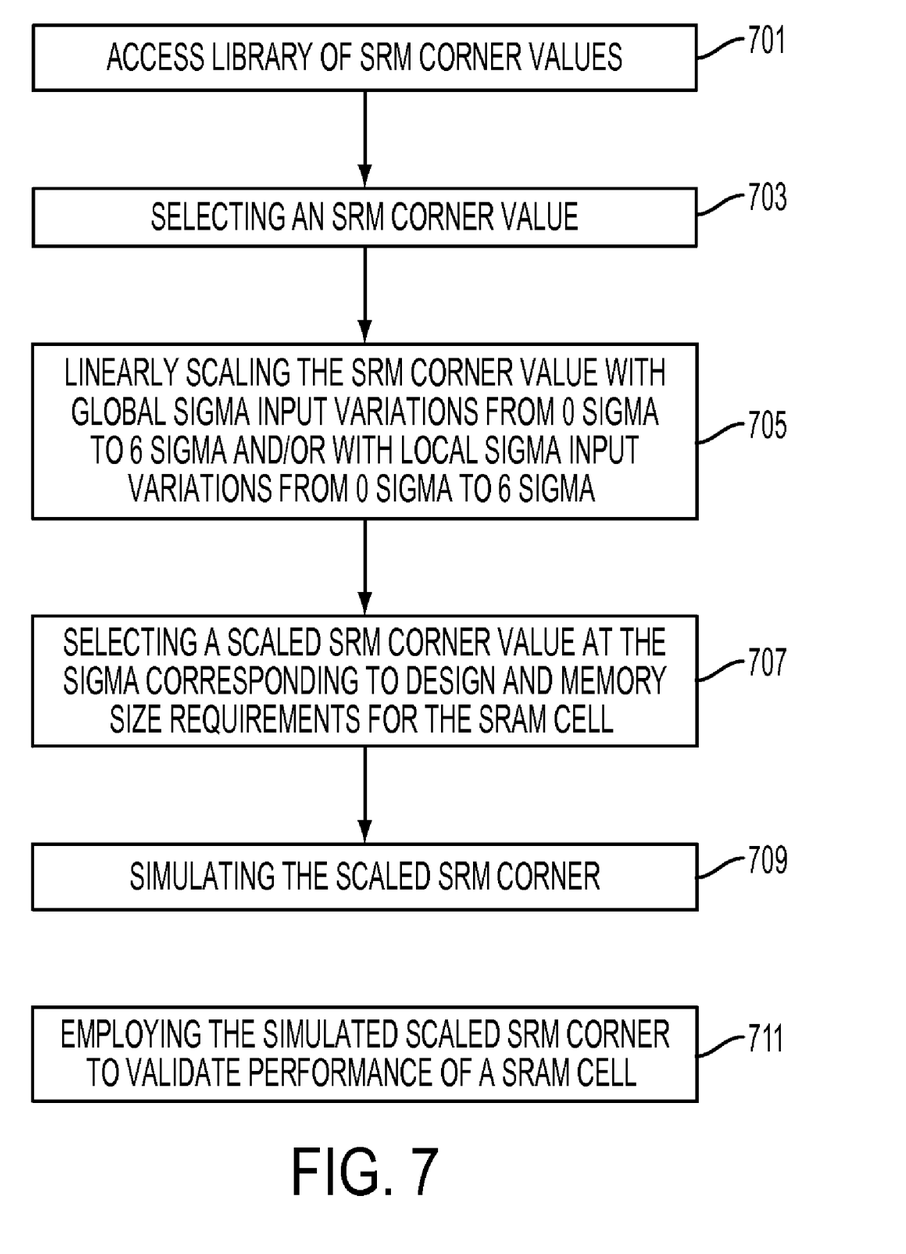
FIG. 7 illustrates a process flow for designing for worst case performance of an SRAM utilizing a library of SRM values, in accordance with an exemplary embodiment.

FIG. 7 illustrates a process flow for designing for worst case performance of an SRAM utilizing a library of SRM values. In step 701, a library of SRM corner values is accessed. As described above, the SRM corner values represent a linear sum of global and local components of $I_{read}$ values for an SRAM cell. The global components are those having been determined by globally varying parameters of the SRAM cell to obtain a G corner, and the local components are those having been determined by locally varying the parameters around the obtained G corner. The designer may select an SRM corner value from the library in step 703.

Adverting to step 705, the SRM corner value may be scaled with global sigma input variations from 0 sigma to 6 sigma and/or with local sigma input variations from 0 sigma to 6 sigma. The designer may then select a scaled SRM corner value at the sigma corresponding to design and memory size requirements for the SRAM cell (step 707). The scaled SRM corner may then be simulated in step 709, and performance of an SRAM cell may be validated in step 711, employing the simulated scaled SRM corner.

The embodiments of the present disclosure can achieve several technical effects, including modeling true worst case performance of an SRAM cell, thereby producing greater yield. Also, the newly defined corner value may be scaled, allowing designers to rely on the library of SRM values rather than running computationally intensive Monte Carlo simulations. The present disclosure enjoys industrial applicability in any of various types of highly integrated semiconductor devices such as SOI and Bulk devices, particularly at the 32 nanometer (nm), 28 nm, and 22 nm technology nodes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A computer-implemented method comprising:
    determining, by a processor, a process corner G of an SRAM cell, having pull-down, pass-gate, and pull-up devices, process corner G being defined as the worst performance of the cell when only global variations of parameters of the SRAM cell are included;
    setting each of the pull-down, pass-gate, and pull-up devices at process corner G;
    performing, on the processor, a number of Monte Carlo simulations of the SRAM cell devices around process corner G with only local variations of the parameters;
    generating a normal probability distribution for $I_{read}$ based on the local Monte Carlo simulations around process corner G;
    extrapolating the worst case $I_{read}$ value from the normal probability distribution of $I_{read}$ to define a process corner SRM representing a slowest SRAM bit on a chip;
    repeating the steps of determining a process corner G, setting individual devices at process corner G, performing Monte Carlo simulations, generating a normal probability distribution, and extrapolating the worst case $I_{read}$ value for multiple SRAM cells;
creating a library of SRM corner values for multiple SRAM cells; and
validating an SRAM cell based on a selected SRM corner from the library.

2. The method according to claim 1, comprising:
tuning sigma values corresponding to local and global variations; and
validating an SRAM cell by varying the channel length, channel width, and threshold voltage globally from 0 sigma to 6 sigma.

3. The method according to claim 1, comprising:
tuning sigma values corresponding to local and global variations;
and validating an SRAM cell by varying the channel length, channel width, and threshold voltage locally from 0 sigma to 6 sigma.

4. The method according to claim 1, comprising tuning the SRM corner to appropriate global sigma settings according to design and memory size specifications.

5. A non-transitory machine readable medium comprising a library of SRM corner values and a program for tuning the SRM corner values, the program executed by the computer, the program further comprising:
a local corner sigma knob for tuning local sigma settings; and
a global corner sigma knob for tuning global sigma settings; and the library further comprising:
the output from the corner sigma knob varying parameters including channel length, channel width, and threshold voltage globally from 0 sigma to 6 sigma;
the output from the corner sigma knob varying parameters including channel length, channel width, and threshold voltage locally from 0 sigma to 6 sigma; and
a linear equation for scaling SRM values linearly with respect to the corner sigma knobs.

6. A machine implemented method of designing for worst case performance of an SRAM cell comprising:
accessing a library, the library comprising SRM corner values, each SRM corner values comprising a linear sum of global and local components of $I_{read}$ values for an SRAM cell, the global components being determined by globally varying parameters of the SRAM cell to obtain a G corner, the local components being determined by locally varying the parameters around the obtained G corner;
selecting an SRM corner value;
linearly scaling the SRM corner value with global sigma input variations from 0 sigma to 6 sigma and/or with local sigma input variations from 0 sigma to 6 sigma;
selecting a scaled SRM corner value at the sigma corresponding to design and memory size requirements for the SRAM cell;
simulating the scaled SRM corner by a processor; and
employing the simulated scaled SRM corner to validate performance of a SRAM cell.

7. The method according to claim 6, comprising globally and locally varying channel length, channel width, and threshold voltage.

* * * * *